US010622996B1

(12) United States Patent
Hsu et al.

(10) Patent No.: US 10,622,996 B1
(45) Date of Patent: Apr. 14, 2020

(54) ADJUSTABLE SENSING CAPACITANCE MICROELECTROMECHANICAL SYSTEM (MEMS) APPARATUS

(71) Applicant: INDUSTRIAL TECHNOLOGY RESEARCH INSTITUTE, Hsinchu (TW)

(72) Inventors: Yu-Wen Hsu, Tainan (TW); Chao-Ta Huang, Hsinchu (TW); Chin-Fu Kuo, Tainan (TW); Che-Kai Yeh, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/369,930

(22) Filed: Mar. 29, 2019

(51) Int. Cl.
*G01D 5/24* (2006.01)
*H01G 7/00* (2006.01)
(Continued)

(52) U.S. Cl.
CPC ............. *H03K 17/962* (2013.01); *G01D 5/24* (2013.01); *G01L 1/146* (2013.01); *H01G 7/00* (2013.01);
(Continued)

(58) Field of Classification Search
CPC .......... H05K 2201/10015; H05K 2201/10712; H03K 17/962; H03K 17/975; H03K 2217/94073; H03K 2217/9607; H03K 2217/96074; H03K 2217/960755; H03K 2217/96077; H01G 2/06; H01G 5/00; H01G 5/01; H01G 5/011; H01G 5/019;
(Continued)

(56) References Cited

U.S. PATENT DOCUMENTS 8,499,630 B2 * 8/2013 Gerfers ................. G01P 15/125
73/509
9,046,367 B2 * 6/2015 Su ....................... G01C 19/5747
(Continued)

FOREIGN PATENT DOCUMENTS

CN 201312300 Y 9/2009
TW 201231937 A 8/2012

OTHER PUBLICATIONS

Reliability Analysis of Self-Repairable MEMS Accelerometer,Xingguo Xiong, Yu-Liang Wu, and Wen-Ben Jone,21th IEEE International Symposium on Defect and Fault Tolerance in VLSI Systems (DFT'06), Oct. 1, 2006, 236-244.
(Continued)

*Primary Examiner* — Vanessa Girardi
(74) *Attorney, Agent, or Firm* — Maschoff Brennan

(57) ABSTRACT

An adjustable sensing capacitance microelectromechanical system (MEMS) apparatus includes an ASIC and a sensing component. The ASIC includes a top surface, a readout circuit and a plurality of electrical switches. The sensing component, configured to sensing physical quantity, includes a fixed electrode and a movable electrode. The fixed electrode includes a plurality of electrode units. The movable electrode is able to be moved relative to the fixed electrode. The electrical switches are respectively and electrically coupled to the electrode units so as to control a working status of each of the electrode units, thereby changing a sensing capacitance of the MEMS sensor.

20 Claims, 8 Drawing Sheets

(51) Int. Cl.
  *H01H 59/00* (2006.01)
  *H02J 50/05* (2016.01)
  *H03H 7/00* (2006.01)
  *H03K 17/96* (2006.01)
  *G01L 1/14* (2006.01)
(52) U.S. Cl.
  CPC ......... *H01H 59/0009* (2013.01); *H02J 50/05* (2016.02); *H03H 7/004* (2013.01)
(58) Field of Classification Search
  CPC ............ H01G 5/04; H01G 7/00; H01G 9/004; H01H 1/0036; B81C 2203/07; B81C 2203/0707
  See application file for complete search history.

(56) References Cited

U.S. PATENT DOCUMENTS

| | | | |
|---|---|---|---|
| 9,142,363 B2 | 9/2015 | Heim | |
| 9,383,282 B2 | 7/2016 | Besling et al. | |
| 9,411,474 B2 | 8/2016 | Rauhala et al. | |
| 9,525,417 B2 | 12/2016 | Inada et al. | |
| 9,576,738 B2 * | 2/2017 | Steeneken | H01G 5/16 |
| 9,797,750 B2 | 10/2017 | Moon et al. | |
| 9,851,384 B2 * | 12/2017 | van Bezooijen | H03H 7/40 |
| 10,037,098 B2 | 7/2018 | Bae et al. | |
| 10,320,228 B2 * | 6/2019 | Fine | H02J 50/12 |

OTHER PUBLICATIONS

Highly programmable temperature compensated readout circuit for capacitive microaccelerometer, Hyoungho Ko, Dong-il "Dan" Cho, Sensors and Actuators A: Physical, Mar. 1, 2010, 72-83.

Jamming user interfaces: Programmable particle stiffness and sensing for malleable and shape-changing devices, Sean Follmer1, Daniel Leithinger1, Alex Olwal1, Nadia Cheng2, and Hiroshi Ishii, Association for Computing Machinery (ACM), Oct. 1, 2012.

* cited by examiner

ADJUSTABLE SENSING CAPACITANCE MICROELECTROMECHANICAL SYSTEM (MEMS) APPARATUS

TECHNICAL FIELD

The disclosure relates to a microelectromechanical system (MEMS) sensor, more particularly to a MEMS apparatus with adjustable sensing capacitance.

RELATED ART

A MEMS apparatus is a device that converts measured variation of physical quantity into the variation of capacitance. The MEMS apparatus can work as a variable capacitor. Because of the characteristics of simple structure, small size, high sensitivity, high resolution and non-contact measurement, the MEMS apparatus is widely used in the sensors for detecting the variation of mechanical physical quantity such as displacement, acceleration, vibration, pressure, pressure difference and liquid height.

A conventional capacitive MEMS apparatus includes an upper electrode and a lower electrode, one of which is a fixed electrode, and the other is a movable electrode. When an external force is applied on the movable electrode, the movable electrode is deformed so as to move toward to the fixed electrode. The capacitance of the capacitive MEMS apparatus is effected by the distance between the fixed electrode and the movable electrode. The capacitance is changed by a certain amount of change in the distance between the two electrodes, and thus an electrical potential difference between the two electrodes is changed. By reading the electrical potential before and after the deformation of movable electrode, a user can estimate the degree of the variation of physical quantity.

Because of increasing demand for micro detection, the capacitive MEMS apparatus is required to highly sensitive for detecting small variation of physical quantity. Generally, it is desirable that a small variation of distance between the fixed electrode and the movable electrode will generate obvious variation of electrical potential difference, such that the sensitivity of the MEMS apparatus is improved. However, if a capacitive MEMS apparatus for micro detection is used to detect large variation of physical quantity, an overly large variation of electrical potential difference may burn out integrated circuits in the capacitive MEMS apparatus. Therefore, the conventional MEMS apparatus for micro detection is inapplicable to the detection of large variation of physical quantity.

SUMMARY

The present disclosure provides a MEMS apparatus with adjustable sensing capacitance, which the sensing capacitance can be adjusted appropriately. It enables the MEMS apparatus in the present disclosure to detect small variation of first physical quantity or to detect large variation of second physical quantity by adjusting the sensing capacitance.

According to one aspect of the present disclosure, a microelectromechanical system apparatus with adjustable sensing capacitance includes an application specific integrated circuit (ASIC) and a sensing component. The ASIC includes a top surface, a readout circuit and a plurality of electrical switches. The sensing component is configured to detect a physical quantity. The sensing component includes a fixed electrode and a movable electrode. The fixed electrode includes a plurality of electrode units, and the movable electrode is able to move relative to the fixed electrode. The electrical switches are electrically coupled to respective electrode units, and a sensing capacitance of the sensing component is adjusted when a working status of one of the electrode units is controlled by corresponding one of the electrical switches.

According to another aspect of the present disclosure, a microelectromechanical system apparatus with adjustable sensing capacitance includes a substrate, an ASIC, a first sensing component configured to detect a first physical quantity and a second sensing component configured to detect a second physical quantity. The ASIC is disposed on the substrate, and the ASIC includes a readout circuit, a plurality of first electrical switches and a plurality of second electrical switches. The first sensing component is disposed on the substrate, and the first sensing component includes a first fixed electrode and a first movable electrode movable. The first fixed electrode includes a plurality of first electrode units. The first movable electrode is able to move relative to the first fixed electrode. The first electrical switches are electrically coupled to respective first electrode units, and a sensing capacitance of the first sensing component is adjusted when a working status of one of the first electrode units is controlled by corresponding one of the first electrical switches.

The second sensing component is disposed on the substrate and the second sensing component includes a second fixed electrode and a second movable electrode. The second fixed electrode includes a plurality of second electrode units. The second movable electrode is able to move relative to the second fixed electrode. The second electrical switches are electrically coupled to respective second electrode units, and a sensing capacitance of the second sensing component is adjusted when a working status of one of the second electrode units is controlled by corresponding one of the second electrical switches.

According to the MEMS apparatus with adjustable sensing capacitance of the present disclosure, the electrical switches are electrically coupled to respective electrode units, such that the working status of one electrode unit is controlled by corresponding one electrical switch. The sensing capacitance of the MEMS apparatus is able to be adjusted by independently controlling the working status of the electrode units. The MEMS apparatus with adjustable sensing capacitance is favorable for precisely detecting the variation of physical quantity as well as preventing the ASIC from breaking down. When the MEMS apparatus is required to detect small variation of physical quantity, most of the electrode units is in the turn-on state (a working status in which the electrode unit is supplied with electric charge). When the MEMS apparatus is required to detect large variation of physical quantity, few electrode units is in the turn-on state so as to prevent the readout circuit of the ASIC from malfunction.

The above description of the summary and the description of the following embodiments are provided to illustrate and explain the spirit and principles of this disclosure, and to provide further explanation of the scope of this disclosure.

DETAILED DESCRIPTION

Figure 1:
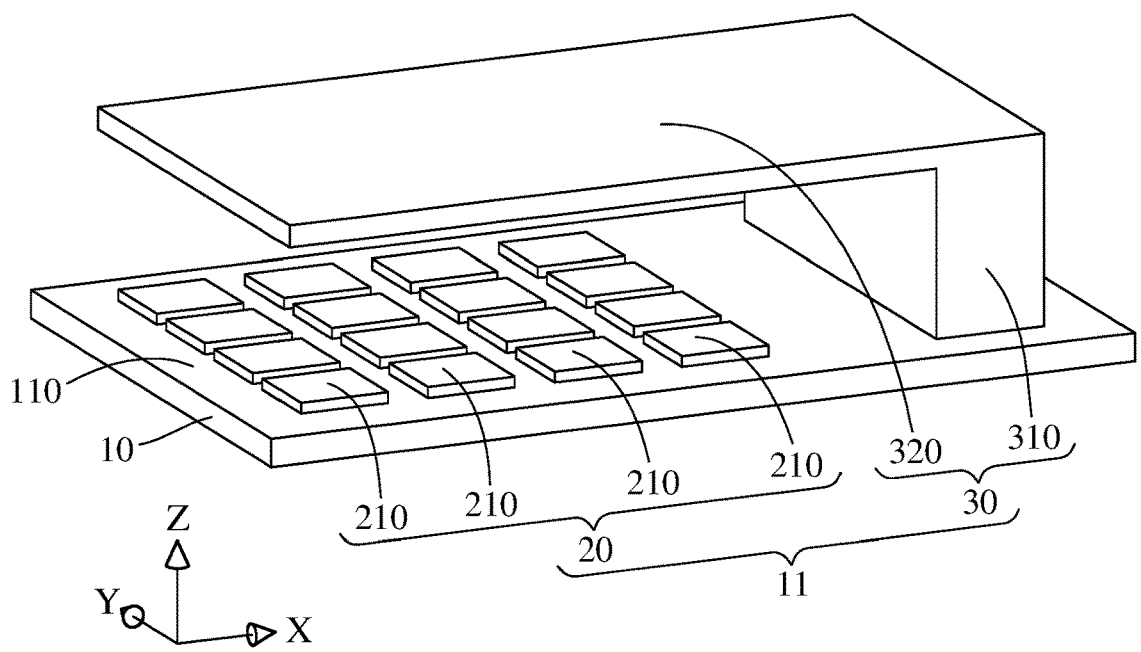
FIG. 1 is a perspective view of a MEMS apparatus with adjustable sensing capacitance according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to one embodiment of the present disclosure, a MEMS sensor includes an ASIC, a fixed electrode and a movable electrode. Please refer to FIG. 1, which is a perspective view of a MEMS apparatus with adjustable sensing capacitance according to a first embodiment of the present disclosure. In this embodiment, a MEMS apparatus with adjustable sensing capacitance 1 includes an ASIC 10 and a sensing component 11.

The ASIC 10 is an integrated circuit chip customized for a particular use. The ASIC 10 includes a top surface 110.

The sensing component 11 includes a fixed electrode 20 and a movable electrode 30. The fixed electrode 20 is disposed on the top surface 110 of the ASIC 10. The fixed electrode 20 includes a plurality of electrode units 210 spaced apart from each other. The electrode unit 210, for example, is a conductive metal pad disposed on the top surface 110 of the ASIC 10. It is worth noting that the present disclosure is not limited by the number of the electrode units 210 depicted in FIG. 1.

The movable electrode 30 is able to move relative to the fixed electrode 20. In detail, the movable electrode 30 includes a fixed portion 310 and a movable portion 320 connected to each other. The fixed portion 310 is disposed on the top surface 110 of the ASIC 10, and the movable portion 320 corresponds to the electrode units 210. One end of the movable portion 320 of the movable electrode 30 is connected to the fixed portion 310, and opposite end of the movable portion 320 overhangs the electrode units 210. When the movable portion 320 is deformed by an external force applied on the movable electrode 30, the overhung end of the movable portion 320 moves relative to the fixed electrode 20 so as to be toward or away from the electrode units 210, and thus a distance between the electrode unit 210 and the overhung end of the movable portion 320 is changed. A sensing capacitance of the MEMS apparatus with adjustable sensing capacitance 1 is adjusted by changing the distance between the electrode unit 210 and the overhung end of the movable portion 320.

Figure 2:
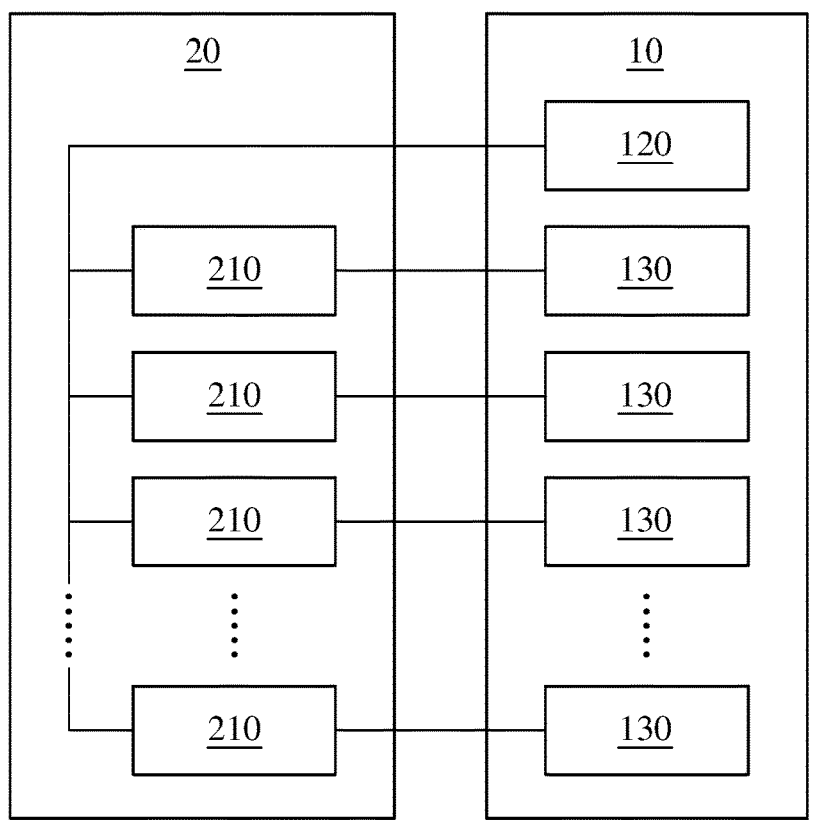
FIG. 2 is a schematic view showing electrical connection between an ASIC and multiple electrode units of the MEMS apparatus with adjustable sensing capacitance in FIG. 1.

Please further refer to FIG. 2, which is a schematic view showing electrical connection between an ASIC and electrode units of the MEMS apparatus with adjustable sensing capacitance in FIG. 1. In this embodiment, the ASIC 10 further includes a readout circuit 120 and a plurality of electrical switches 130. The number of the electrical switches 130 corresponds to the number of the electrode units 210.

The readout circuit 120 is electrically coupled to the electrode units 210 of the fixed electrode 20 in order to read an electrical potential difference between the fixed electrode 20 and the movable electrode 30, thereby obtaining the capacitance of the MEMS apparatus with adjustable sensing capacitance 1.

The electrical switches 130 are electrically coupled to respective electrode units 210 of the fixed electrode 20, and each electrical switch 130 is configured to control a working status of respective electrode unit 210. In one embodiment, the electrical switch 130 is a capacitance sensing switch. In another embodiment, electrical switch 130 is a resettable fuse switch.

The working status of the electrode unit 210 includes a turn-on state and a turn-off state. When the electrical switch 130 of the ASIC 10 is switched on such that the ASIC 10 is able to supply electric charge to the electrode unit 210 through respective electrical switch 130, this electrode unit 210 is in the turn-on state. In the turn-on state, the electrical potential difference is existed between the fixed electrode 20 and the movable electrode 30. On the contrary, when the electrical switch 130 is switched off such that the ASIC 10 is unable to supply electric charge to the electrode unit 210, this electrode unit 210 is in the turn-off state. In the turn-off state, there is no electrical potential difference between the fixed electrode 20 and the movable electrode 30. A sensing capacitance of the sensing component 11 is adjusted when the working status of one of the electrode units 210 is controlled by corresponding one of the electrical switches 130. More specifically, one of the electrode units 210 is in the turn-on state when the ASIC 10 supplies electric charge to this electrode unit 210 through corresponding one of the electrical switches 130. One of the electrode units 210 is in the turn-off state when the ASIC 10 does not supply electric charge to this electrode unit 210.

The present disclosure is not limited by the aforementioned specific method of controlling the working status of the electrode unit 210 by electrical switch 130. For example, a user may manually control the electrical switch 130 to determine whether the ASIC supplies electric charge to respective electrode unit 210; or, the electrical switch 130 is automatically controlled by an operating instruction in an external register (not shown in the drawings) to determine whether the ASIC supplies electric charge to respective electrode unit 210.

Figure 3:
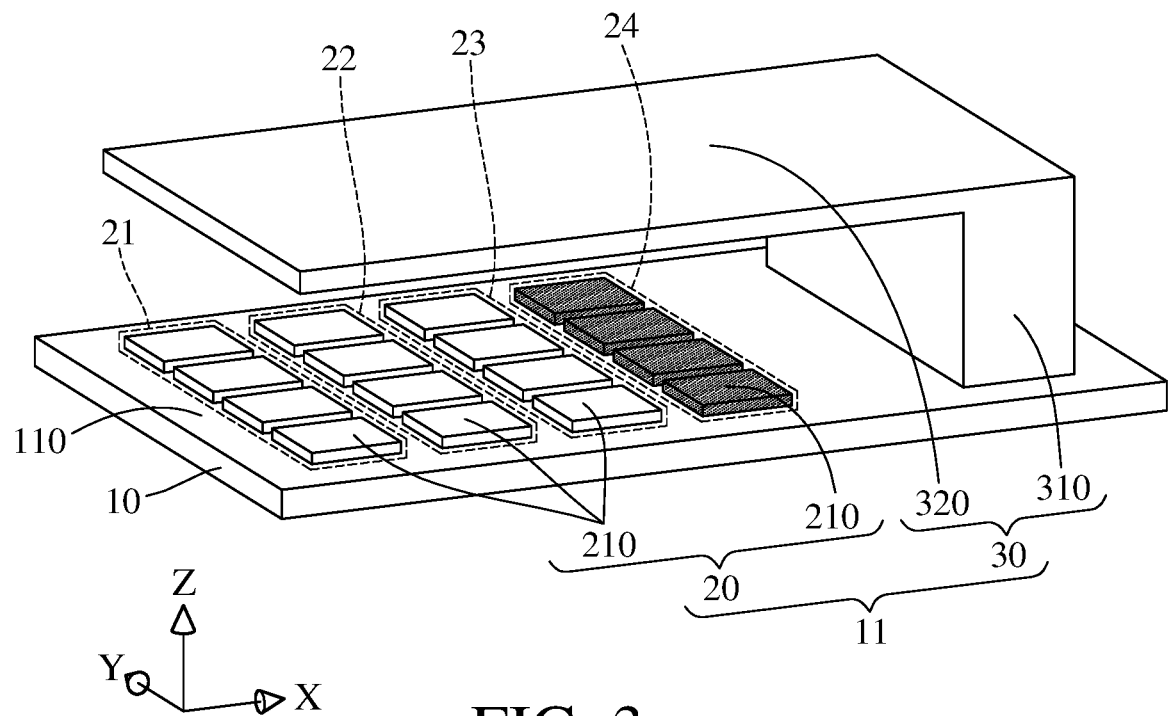
FIG. 3 is a schematic view showing working status of the electrode units when a small variation of physical quantity is detected by the MEMS apparatus with adjustable sensing capacitance in FIG. 1.
Figure 4:
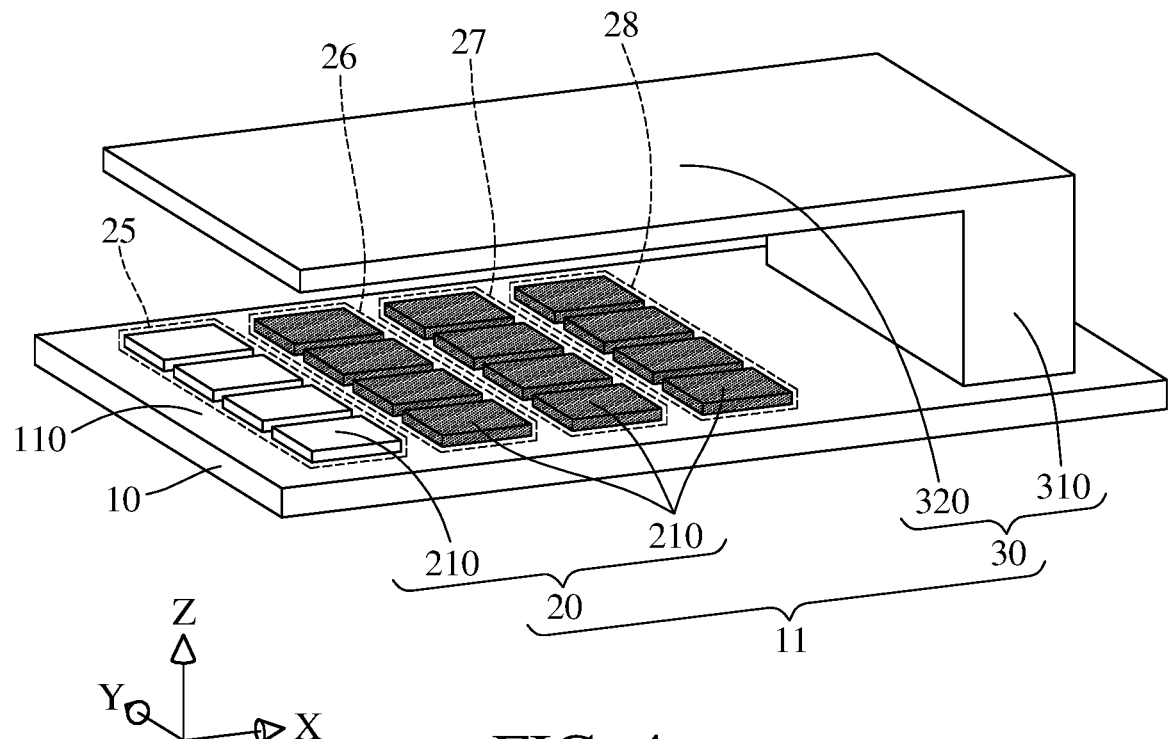
FIG. 4 is a schematic view showing working status of the electrode units when a larger variation of physical quantity is detected by the MEMS apparatus with adjustable sensing capacitance in FIG. 1.

A method of detecting a variation of physical quantity by the MEMS apparatus with adjustable sensing capacitance 1 is described hereafter. Please refer to FIG. 3 and FIG. 4. FIG. 3 is a schematic view showing working status of the electrode units when a small variation of physical quantity is detected by the MEMS apparatus with adjustable sensing capacitance in FIG. 1. FIG. 4 is a schematic view showing working status of the electrode units when a larger variation of physical quantity is detected by the MEMS apparatus with adjustable sensing capacitance in FIG. 1. In FIG. 3 and FIG. 4, the electrode units 210 in dark color are in the turn-off state, while the electrode units 210 in white color are in the turn-on state.

According to one embodiment of the present disclosure, the electrical switches 130 control respective electrode units 210 of the fixed electrode 20. More specifically, several electrode units 210 of the fixed electrode 20 are arranged on the top surface 110 of the ASIC 10 so as to form an electrode assembly. According to the working status of each electrode unit 210 in the electrode assembly, the electrode units 210 are grouped in electrode assemblies. FIG. 3 and FIG. 4 show a 4×4 (4 rows by 4 columns) electrode units array, while the present disclosure is not limited by number of rows and number of columns of the electrode units array.

In FIG. 3, the electrode units 210 are grouped in electrode assemblies 21, 22, 23 and 24. In this embodiment, each of the electrode assemblies 21, 22, 23 and 24 includes multiple electrode units 210 arranged along Y-axis. Each of the electrical switches 130 can be switched on by the control of the ASIC 10, such that electric charge can flow to the electrode units 210 of the electrode assemblies 21, 22 and 23 through respective electrical switches 130, and thus each of electrode units 210 in the electrode assemblies 21, 22 and 23 is in the turn-on state. Meanwhile, each of the electrical switches 130 can be switched off by the control of the ASIC 10, such that electric charge cannot flow to the electrode units 210 of the electrode assembly 24 through respective electrical switches 130, and thus each electrode unit 210 of the electrode assembly 24 is in the turn-off state.

In FIG. 4, the electrode units 210 are grouped in electrode assemblies 25, 26, 27 and 28. Similarly, some electrical switches 130 can be switched on by the control of the ASIC 10 so as to supply electric charge to the electrode units 210 of the electrode assembly 25 through respective electrical switches 130, and thus each electrode unit 210 of the electrode assembly 25 is in the turn-on state. Meanwhile, the other electrical switches 130 can be switched off by the control of the ASIC 10 so as to be unable to supply electric charge to the electrode units 210 of the electrode assemblies 26, 27 and 28, and thus each electrode unit 210 of the electrode assemblies 26, 27 and 28 is in the turn-off state.

The present disclosure is not limited by the arrangement of the electrode assemblies depicted in FIG. 3 and FIG. 4. In another embodiment, the electrode units 210 of two adjacent electrode assemblies are all in the turn-on state, and the electrode units 210 of the other two adjacent electrode assemblies are all in the turn-off state. In still another embodiment, all electrode units 210 can be in the turn-on state.

As mentioned above, some electrical switches 130 of the ASIC 10 are respectively controlled to be switched on, such that ASIC 10 can supply electric charge to respective electrode units 210 through respective electrical switches 130. The other electrical switches 130 are respectively controlled to be switched off, such that these electrical switches 130 are unable to supply electric charge to respective electrode units 210. By controlling the working status of the electrode units 210 or the electrode assemblies, the sensing capacitance of the MEMS apparatus with adjustable sensing capacitance 1 can be adjusted. Thus, the MEMS apparatus with adjustable sensing capacitance 1 is applicable to detect different physical quantities, thereby preventing the ASIC 10 from malfunction due to overly larger sensing capacitance.

For exemplary illustration, an application of the MEMS apparatus with adjustable sensing capacitance 1 for detecting pressure is described in the following paragraphs, while the present disclosure is not limited by the specific physical quantity mentioned above. For examples, the MEMS apparatus with adjustable sensing capacitance 1 can be applied to detect various physical quantities such as displacement, acceleration, vibration and atmospheric pressure.

Firstly, the application of the MEMS apparatus with adjustable sensing capacitance 1 for detecting small pressure variation (for example, a pressure variation of 100~1000 Pascal) is described. When the pressure is applied on the movable electrode 30 of the MEMS apparatus with adjustable sensing capacitance 1, the movable portion 320 is deformed such that the distance between the movable portion 320 and the electrode unit 210 is changed. Since a smaller pressure applied on the movable electrode 30, there is a small variation of the distance between the movable portion 320 and the electrode unit 210. At this time, in order to make the readout circuit 120 of the ASIC 10 successfully read higher sensing capacitance out, it is required that the MEMS apparatus with adjustable sensing capacitance 1 should have higher sensitivity. As shown in FIG. 3, three groups of the electrical switches 130 control the working status of the electrode units 210 in respective electrode assemblies 21, 22 and 23, such that these electrode units 210 are in the turn-on state. Meanwhile, the other group of the electrical switches 130 controls the working status of the electrode units 210 in the electrode assembly 24, such that these electrode units 210 are in the turn-off state. When detecting small pressure variation, the MEMS apparatus with adjustable sensing capacitance 1 is with higher sensing capacitance since most of the electrode units 210 are in the turn-on state. At that moment, a small variation of the distance between the movable portion 320 and the electrode unit 210 will generate relatively large variation of electrical potential difference. Therefore, the MEMS apparatus with adjustable sensing capacitance 1 in FIG. 3, with most of the electrode units 210 in the turn-on state, is suitable for the detection of small pressure variation.

However, the MEMS apparatus with adjustable sensing capacitance 1 in FIG. 3 is not suitable to detect larger pressure variation (for example, a pressure variation of larger than $10^5$ Pascal). When a large pressure is applied on the movable electrode 30, the readout circuit 120 may break down due to overly high sensing capacitance of the MEMS apparatus with adjustable sensing capacitance 1. Thus, it is required to adjust the sensing capacitance of the MEMS apparatus with adjustable sensing capacitance 1 by changing the working status of the electrode unit 210.

As shown in FIG. 4, one group of the electrical switches 130 controls the working status of the electrode units 210 in the electrode assembly 25, such that these electrode units 210 are in the turn-on state. Meanwhile, the other three groups of the electrical switches 130 control the working status of the electrode units 210 in respective electrode assemblies 26, 27 and 28, such that these electrode units 210 are in the turn-off state. The MEMS apparatus with adjustable sensing capacitance 1 is with lower sensing capacitance since few electrode units 210 are in the turn-on state. At this moment, even though a large variation of the distance between the movable portion 320 and the electrode unit 210, a capacitance variation generated by the variation of distance is not overly large, thereby preventing the readout circuit 120 from breaking down. Therefore, the MEMS apparatus with adjustable sensing capacitance 1 in FIG. 4, with most of the electrode units 210 in the turn-off status, is suitable for the detection of large pressure variation.

According to the present disclosure, the sensing capacitance of the MEMS apparatus with adjustable sensing capacitance 1 is able to be adjusted by making the electrical switches 130 control the working status of respective electrode units 210. The user or a control system can increase or decrease the sensing capacitance of the MEMS apparatus with adjustable sensing capacitance 1 according to the physical quantity proposed to be detected. As to the detection of small variation of the physical quantity, most of the electrode units 210 are in the turn-on state so as to increase the sensing capacitance of the MEMS apparatus with adjustable sensing capacitance 1, and thus the capacitance variation between the fixed electrode 20 and the movable electrode 30 can be successfully read. As to the detection of large variation of the physical quantity, few electrode units 210 are in the turn-on state so as to decrease the sensing capacitance of the MEMS apparatus with adjustable sensing capacitance 1, and thus the readout circuit 120 is prevented from breaking down due to overly large variation of physical quantity.

Figure 5:
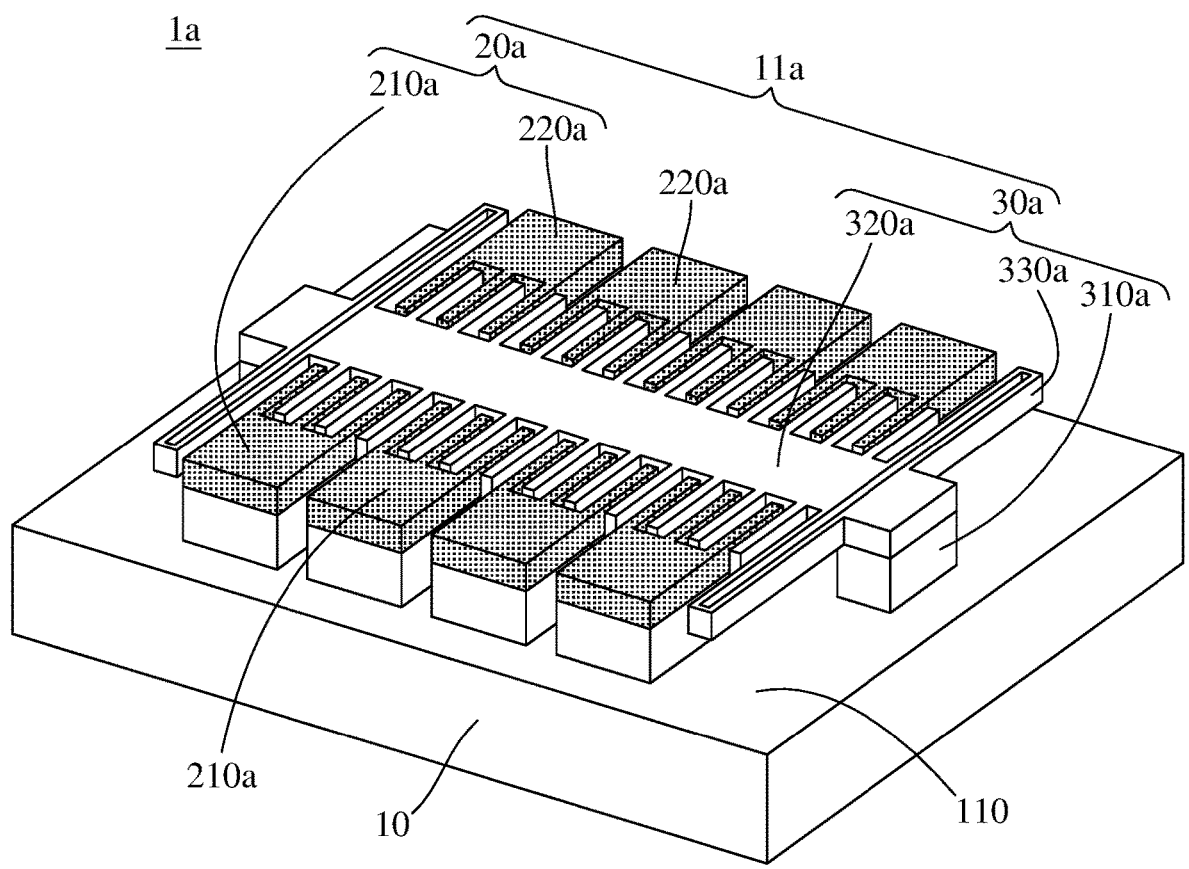
FIG. 5 is a perspective view of a MEMS apparatus with adjustable sensing capacitance according to a second embodiment of the present disclosure.
Figure 6:
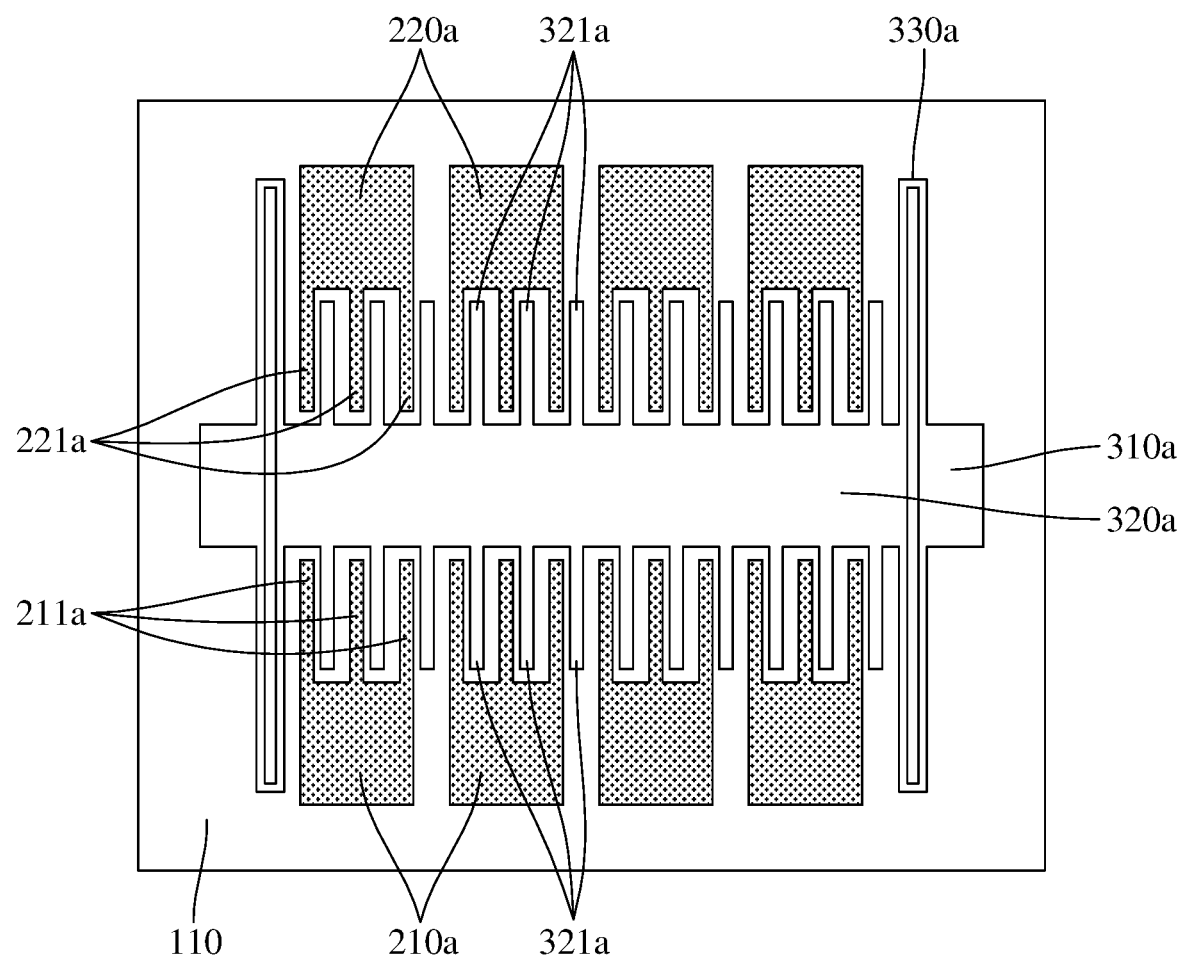
FIG. 6 is a top view of the MEMS apparatus with adjustable sensing capacitance in FIG. 5.

Other embodiments of the MEMS apparatus with adjustable sensing capacitance are disclosed in the following paragraphs. FIG. 5 is a perspective view of a MEMS apparatus with adjustable sensing capacitance according to a second embodiment of the present disclosure. FIG. 6 is a top view of the MEMS apparatus with adjustable sensing capacitance in FIG. 5. In this embodiment, a MEMS apparatus with adjustable sensing capacitance 1a includes an ASIC 10 and a sensing component 11a. The detail description of the ASIC 10 can be referred to the first embodiment, and will be omitted hereafter.

The ASIC 10 includes a top surface 110, a readout circuit and a plurality of electrical switches. The sensing component 11a includes a fixed electrode 20a and a movable electrode 30a. The fixed electrode 20a includes a plurality of first electrode units 210a spaced apart from each other and a plurality of second electrode units 220a spaced apart from each other.

The first electrode units 210a and the second electrode units 220a are disposed on the top surface 110 of the ASIC 10. The readout circuit is electrically coupled to the first electrode units 210a and the second electrode units 220a in order to read an electrical potential difference between the fixed electrode 20a and the movable electrode 30a. Some of the electrical switches are electrically coupled to respective first electrode units 210a, and the other electrical switches are electrically coupled to respective second electrode units 220a. Each electrical switch is configured to control a working status of respective first electrode unit 210a or a working status of respective second electrode unit 220a. It is worth noting that the present disclosure is not limited by the number of the first electrode units 210a and that of the second electrode units 220a.

The movable electrode 30a includes a fixed portion 310a, a movable portion 320a and a flexible portion 330a connected to each other. The fixed portion 310a is disposed on the top surface 110 of the ASIC 10, and the movable portion 320a is connected to the fixed portion 310a via the flexible portion 330a. The first electrode units 210a and the second electrode units 220a are respectively located on opposite sides of the movable portion 320a. The movable electrode 30a is able to move relative to the fixed electrode 20a along a direction perpendicular to a normal line of the top surface 110.

In this embodiment, a configuration including the fixed electrode 20a and the movable electrode 30a forms a comb-electrode structure. As shown in FIG. 6, each of the first electrode units 210a includes a plurality of first electrode fingers 211a, and each of the second electrode units 220a includes a plurality of second electrode fingers 221a. The movable portion 320a of the movable electrode 30a includes a plurality of third electrode fingers 321a. When the movable portion 320a moves relative to the fixed electrode 20a, the sensing capacitance of the MEMS apparatus with adjustable sensing capacitance 1a is changed. The sensing capacitance of the MEMS apparatus with adjustable sensing capacitance 1a is able to be adjusted by making the ASIC 10 control the working status of each of the first electrode unit 210a and the second electrode unit 220a. The sensing capacitance of the MEMS apparatus with adjustable sensing capacitance 1a is increased or decreased according to the degree of variation of the physical quantity.

Figure 7:
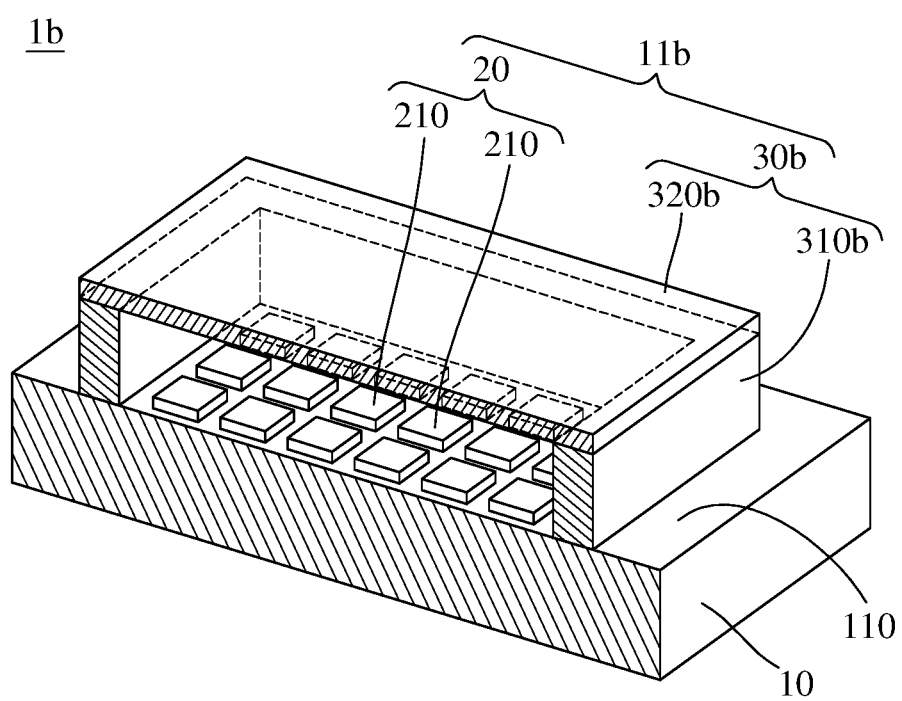
FIG. 7 is a perspective and cross-sectional view of a MEMS apparatus with adjustable sensing capacitance according to a third embodiment of the present disclosure.

FIG. 7 is a perspective and cross-sectional view of a MEMS apparatus with adjustable sensing capacitance according to a third embodiment of the present disclosure. In this embodiment, a MEMS apparatus with adjustable sensing capacitance 1b includes an ASIC 10 and a sensing component 11b. The detail description of the ASIC 10 can be referred to the first embodiment, and will be omitted hereafter.

The ASIC 10 includes a top surface 110, a readout circuit and a plurality of electrical switches. The sensing component 11b includes a fixed electrode 20 and a movable electrode 30b, and the fixed electrode 20 includes a plurality of electrode units 210 spaced apart from each other.

The electrode units 210 are disposed on the top surface 110 of the ASIC 10. The readout circuit is electrically coupled to the electrode units 210 in order to read an electrical potential difference between the fixed electrode 20 and the movable electrode 30b. The electrical switches are electrically coupled to respective electrode units 210, and each electrical switch is configured to control a working status of respective electrode unit 210.

The fixed portion 310b of the movable electrode 30b surrounds the electrode units 210 of the fixed electrode 20. The movable portion 320b of the movable electrode 30b overhangs the electrode units 210. The movable electrode 30b is bonded with the ASIC 10 to form a hermetic chamber in which the electrode units 210 are accommodated. Therefore, it is favorable for preventing the electrode units 210 from dust in the air.

In this embodiment, the MEMS apparatus with adjustable sensing capacitance 1b with adjustable sensing capacitance is suitable to be used as an altimeter. When the MEMS apparatus with adjustable sensing capacitance 1b is applied to determine an altitude variation of object above a fixed level, most of the electrode units 210 are controlled by the electrical switches so as to be in the turn-on state. Therefore, when the atmospheric pressure slightly changes due to altitude change, the sensing capacitance of the MEMS apparatus with adjustable sensing capacitance 1b can be adjusted to obtain higher value, and thus the ASIC 10 can precisely calculate the altitude change.

In this embodiment, the MEMS apparatus with adjustable sensing capacitance 1b with adjustable sensing capacitance is also suitable to be used as a barometer. When the MEMS apparatus with adjustable sensing capacitance 1b is configured to detect high pressure gas, most of the electrode units 210 are controlled by the electrical switches so as to be in the turn-off state. Therefore, when the barometer is configured to detect high pressure gas in a container, the sensing capacitance of the MEMS apparatus with adjustable sensing capacitance 1b can be adjusted to obtain lower value so as to prevent the ASIC 10 from breaking down.

Figure 8:
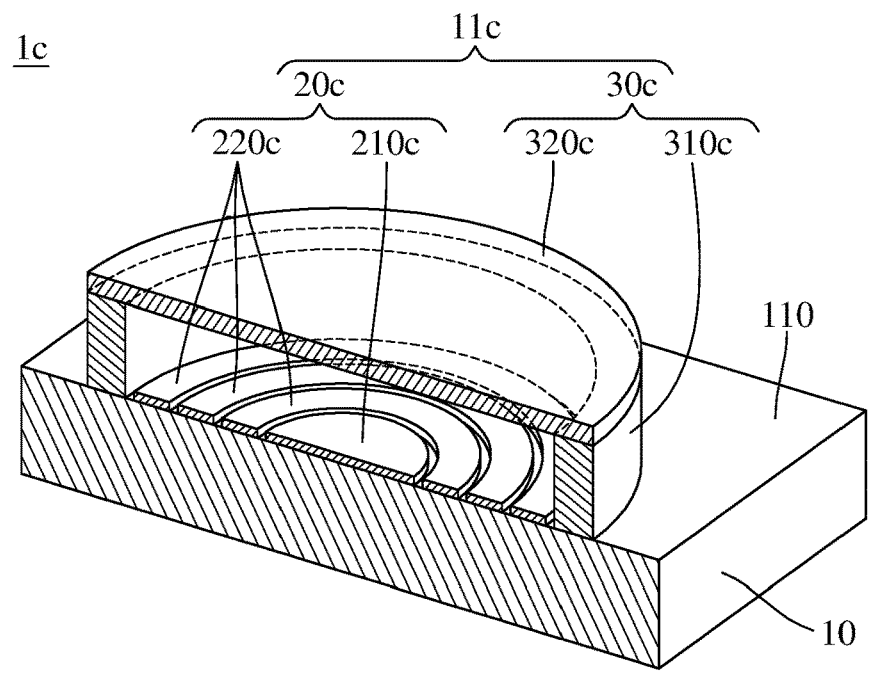
FIG. 8 is a perspective and cross-sectional view of a MEMS apparatus with adjustable sensing capacitance according to a fourth embodiment of the present disclosure.
Figure 9:
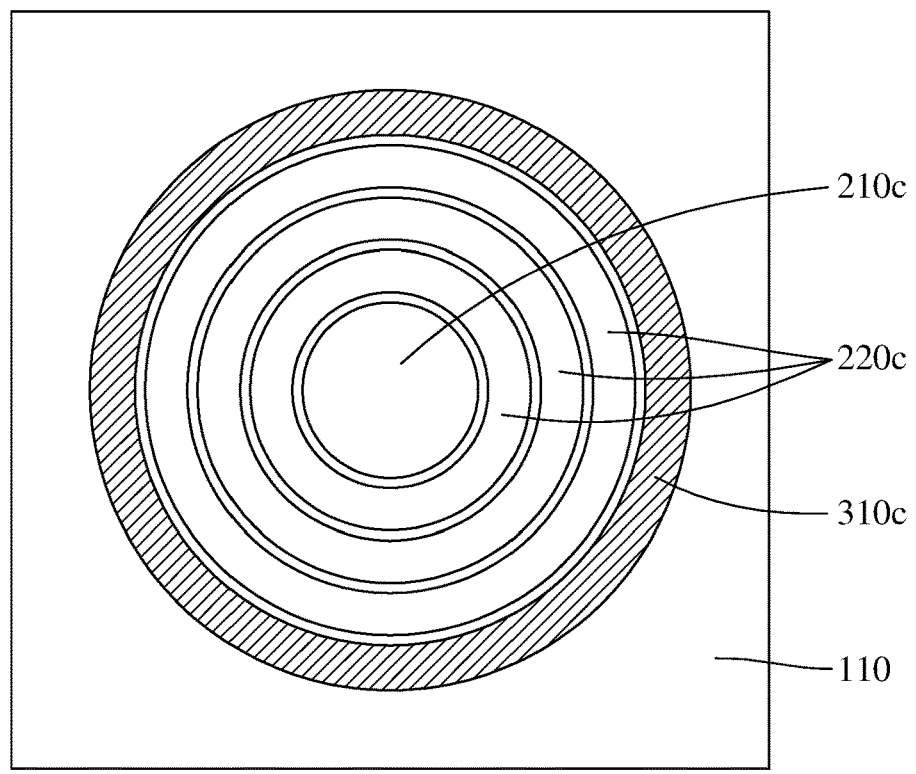
FIG. 9 is a cross-sectional view of the MEMS apparatus with adjustable sensing capacitance in FIG. 8.

Please refer to FIG. 8 and FIG. 9. FIG. 8 is a perspective and cross-sectional view of a MEMS apparatus with adjustable sensing capacitance according to a fourth embodiment of the present disclosure. FIG. 9 is a cross-sectional view of the MEMS apparatus with adjustable sensing capacitance in FIG. 8. In this embodiment, a MEMS apparatus with adjustable sensing capacitance 1c includes an ASIC 10 and a sensing component 11c. The detail description of the ASIC 10 can be referred to the first embodiment, and will be omitted hereafter.

The ASIC 10 includes a top surface 110, a readout circuit and a plurality of electrical switches. The sensing component 11c includes a fixed electrode 20c and a movable electrode 30c.

The fixed electrode 20c includes a central electrode unit 210c and a plurality of annular electrode units 220c spaced apart from each other, and each of the annular electrode units 220c surrounds the central electrode unit 210c. In detail, the annular electrode units 220c and the central electrode unit 210c are arranged concentrically. The central electrode unit 210c and the annular electrode units 220c are disposed on the top surface 110 of the ASIC 10. The readout circuit is electrically coupled to the central electrode unit 210c and the annular electrode units 220c in order to read an electrical potential difference between the fixed electrode 20c and the movable electrode 30c. One of the electrical switches is electrically coupled to the central electrode unit 210c, and the other electrical switches are electrically coupled to respective annular electrode units 220c. The electrical switch is configured to control a working status of the central electrode unit 210c or a working status of respective annular electrode unit 220c. It is worth noting that the present disclosure is not limited by the number of the annular electrode units 220c.

The fixed portion 310c of the movable electrode 30c surrounds the central electrode unit 210c and the annular electrode units 220c of the fixed electrode 20c. The movable portion 320c of the movable electrode 30c overhangs the central electrode unit 210c and the annular electrode units 220c.

Figure 10:
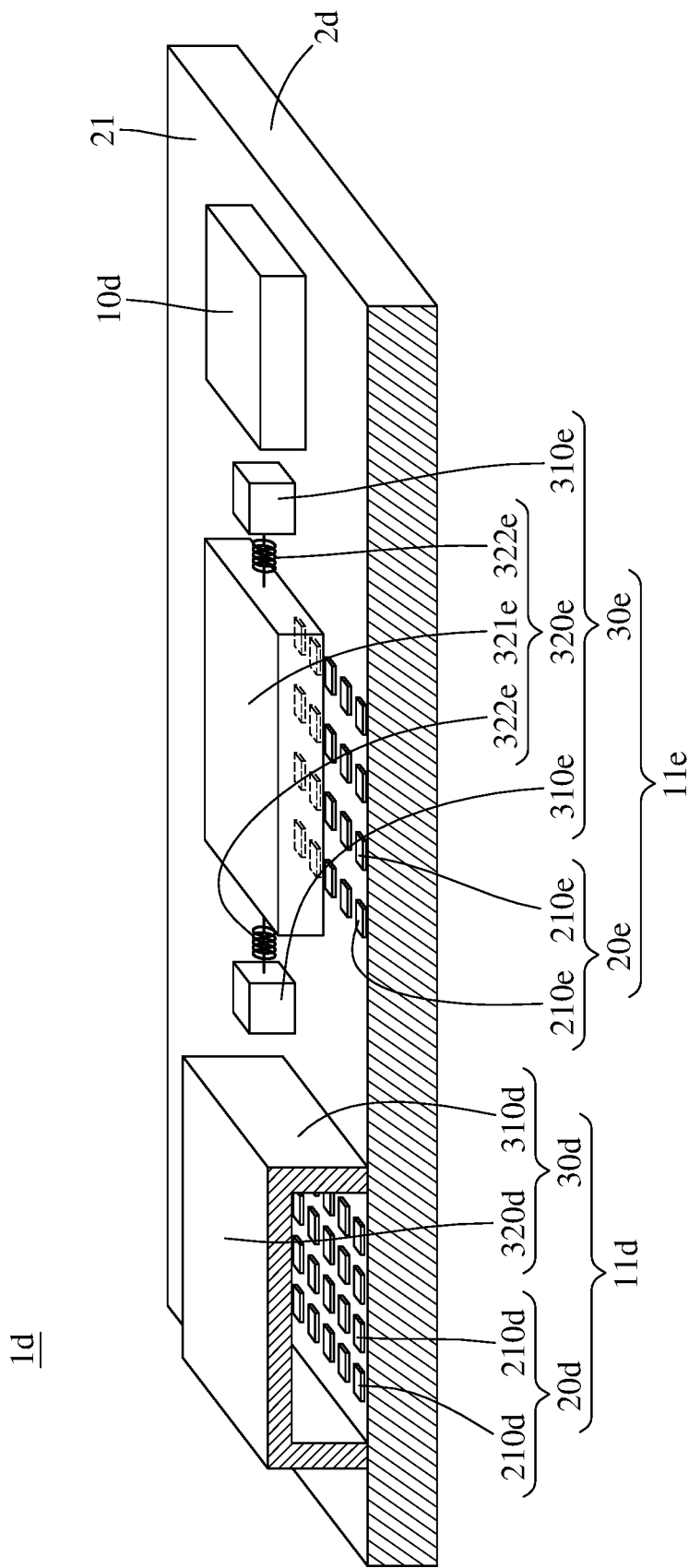
FIG. 10 is a perspective view of a MEMS apparatus with adjustable sensing capacitance according to a fifth embodiment of the present disclosure.
Figure 11:
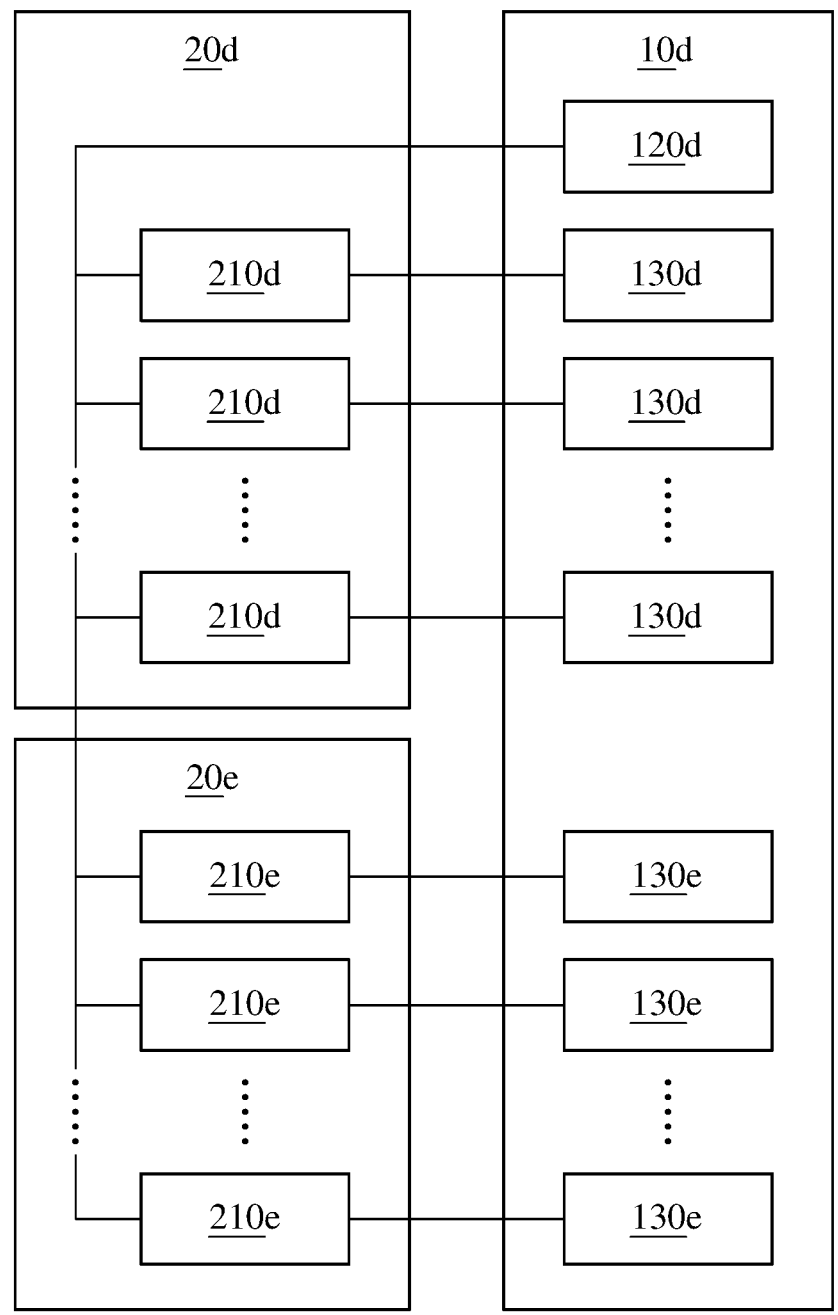
FIG. 11 is a schematic view showing electrical connection between an ASIC and multiple electrode units of the MEMS apparatus with adjustable sensing capacitance in FIG. 10.

Please refer to FIG. 10 and FIG. 11. FIG. 10 is a perspective view of a MEMS apparatus with adjustable sensing capacitance according to a fifth embodiment of the present disclosure. FIG. 11 is a schematic view showing electrical connection between an ASIC and multiple electrode units of the MEMS apparatus with adjustable sensing capacitance in FIG. 10.

In this embodiment, a MEMS apparatus with adjustable sensing capacitance 1d includes a substrate 2d, an ASIC 10d, a first sensing component 11d and a second sensing component 11e.

The substrate 2d, for example, is a silicon substrate including a top surface 21. The ASIC 10d, the first sensing component 11d and the second sensing component 11e are disposed on the top surface 21 of the substrate 2d.

The first sensing component 11d includes a first fixed electrode 20d and a first movable electrode 30d. The first fixed electrode 20d includes a plurality of first electrode units 210d space apart from each other. The first movable electrode 30d includes a first fixed portion 310d and a first movable portion 320d. The first fixed portion 310d is disposed on the substrate 2d and surrounds the first electrode units 210d. The first movable portion 320d overhangs the first electrode units 210d. The first movable electrode 30d is bonded with the ASIC 10d to form a hermetic chamber in which the first electrode units 210d are accommodated. When an external force is applied on the first movable electrode 30d to deform the first movable portion 320d, the first movable portion 320d moves relative to the first fixed electrode 20d so as to change a distance between the first movable portion 320d and the first electrode unit 210d, thereby changing a sensing capacitance between the first fixed electrode 20d and the first movable electrode 30d.

The second sensing component 11e includes a second fixed electrode 20e and a second movable electrode 30e. The second fixed electrode 20e includes a plurality of second electrode units 210e space apart from each other. The second movable electrode 30e includes a plurality of second fixed portions 310e and a second movable portion 320e. The second fixed portions 310e are disposed on the substrate 2d, and the second movable portion 320e is located between the second fixed portions 310e. The second movable portion 320e includes a movable mass 321e and a plurality of elastic components 322e, and each of the elastic components 322e is located between the movable mass 321e and respective second fixed portion 310e. The movable mass block 321e is connected to the second fixed portion 310e via the elastic component 322e, and the movable mass 321e overhangs the second electrode units 210e. The movable mass 321e is able to move relative to the second fixed electrode 20e so as to change a sensing capacitance between the second fixed electrode 20e and the second movable electrode 30e.

The ASIC 10d includes a readout circuit 120d, a plurality of first electrical switches 130d and a plurality of second electrical switches 130e. The number of the first electrical switches 130d corresponds to that of the first electrode units 210d. Similarly, the number of the second electrical switches 130e corresponds to that of the second electrode units 210e. The readout circuit 120d is electrically coupled to the first electrode units 210d in order to read an electrical potential difference between the first fixed electrode 20d and the first movable electrode 30d, thereby obtaining the capacitance of the first sensing component 11d. Moreover, the readout circuit 120d is also electrically coupled to the second electrode units 210d in order to read an electrical potential difference between the second fixed electrode 20d and the second movable electrode 30d, thereby obtaining the capacitance of the second sensing component 11e.

The first electrical switches 130d are electrically coupled to respective first electrode units 210d, and each of the first electrical switches 130d is configured to control a working status of respective first electrode unit 210d. Moreover, the second electrical switches 130e are electrically coupled to respective second electrode units 210e, and each of the second electrical switches 130e is configured to control a working status of respective second electrode unit 210e.

The working status of the first electrode unit 210d and the second electrode unit 210e includes a turn-on state and a turn-off state. When the first electrical switch 130d of the ASIC 10d is switched on such that the ASIC 10d is able to supply electric charge to the first electrode unit 210d through respective first electrical switch 130d, this first electrode unit 210d is in the turn-on state. Similarly, when the second electrical switch 130e of the ASIC 10d is switched on such that the ASIC 10d is able to supply electric charge to respective second electrode unit 210e, this second electrode unit 210e is in the turn-on state. In the turn-on state, the electrical potential difference is existed between the first fixed electrode 20d and the first movable electrode 30d or between the second fixed electrode 20e and the second movable electrode 30e.

On the contrary, when the first electrical switch 130d is switched off such that the ASIC 10d is unable to supply electric charge to respective first electrode unit 210d, this first electrode unit 210d is in the turn-off state. When the second electrical switch 130e is switched off such that the ASIC 10d is unable to supply electric charge to respective second electrode unit 210e, this second electrode unit 210e is in the turn-off state. In the turn-off state, there is no electrical potential difference between the first fixed electrode 20d and the first movable electrode 30d or between the second fixed electrode 20e and the second movable electrode 30e.

The sensing capacitance of the first sensing component 11d is adjusted when the working status of one of the first electrode units 210d is controlled by corresponding one of the first electrical switches 130d. More specifically, one of the first electrode units 210d is in the turn-on state when the ASIC supplies electric charge to this first electrode unit 210d through corresponding one of the first electrical switches 130d. One of the first electrode units 210d is in the turn-off state when the ASIC does not supply electric charge to this first electrode unit 210d.

Moreover, the sensing capacitance of the second sensing component 11e is adjusted when the working status of one the second electrode units 210e is controlled by corresponding one of the second electrical switches 130e. More specifically, one of the second electrode units 210e is in the turn-on state when the ASIC supplies electric charge to this second electrode unit 210e through corresponding one of the second electrical switches 130e. One of the second electrode units 210e is in the turn-off state when the ASIC does not supply electric charge to this second electrode unit 210e.

In this embodiment, the first sensing component 11d is configured to detect a first physical quantity, and the second sensing component 11e is configured to detect a second physical quantity different from the first physical quantity. More specifically, the first sensing component 11d is a barometer, and the second sensing component 11e is an accelerometer.

As shown in FIG. 10, the first electrical switches 130d control respective first electrode units 210d, such that the working status of some first electrode units 210d is in the turn-on state, and the working status of the other first electrode units 210d is in the turn-off state. When the atmospheric pressure around the MEMS apparatus with adjustable sensing capacitance 1d is increased, the first movable portion 320d is deformed, such that the distance between the first movable portion 320d and the first electrode unit 210d is changed. The variation of distance between the first movable portion 320d and the first electrode unit 210d generates a variation of electrical potential difference between the first fixed electrode 20d and the first movable electrode 30d.

Furthermore, the second electrical switches 130e control respective second electrode units 210e, such that the working status of some second electrode units 210e is in the turn-on state, and the working status of the other second electrode units 210e is in the turn-off state. When acceleration of a vehicle (such as car) equipped with the MEMS apparatus with adjustable sensing capacitance 1d is change, the second movable portion 320e moves toward to one of the second fixed portions 310e so as to generate a variation of electrical potential difference between the second fixed electrode 20e and the second movable electrode 30e.

In this embodiment, an area A1 of each first electrode unit 210d is the same as an area A2 of each second electrode unit 210e. When the first sensing component 11d and the second sensing component 11e detect physical quantities at the same time, the number of the first electrode units 210d in the turn-on state is N1, the number of the second electrode units 210e in the turn-on state is N2, and the following condition should be satisfied: N1>N2. Therefore, when the first sensing component 11d detects slight atmospheric pressure variation and the second sensing component 11e detects an acceleration, the second sensing component 11e is prevented from generating an overly high sensing capacitance, and thus the ASIC 10d is prevented from breaking down. In another embodiment, when the first sensing component 11d detects larger variation of first physical quantity and the second sensing component 11e detects smaller variation of second physical quantity, it is proper that each first electrode unit 210d and each second electrode unit 210e has the same area, and the number (N1) of the first electrode units 210d in the turn-on state is smaller than the number (N2) of the second electrode units 210e in the turn-on state.

In another embodiment, when the first sensing component 11d and the second sensing component 11e work at the same time, a total area of the first electrode units 210d in the turn-on state is TA1, a total area of the second electrode units 210e in the turn-on state is TA2, and the following condition should be satisfied: TA1>TA2. Therefore, when the first sensing component 11d detects slight atmospheric pressure variation and the second sensing component 11e detects an acceleration, the second sensing component 11e is prevented from generating an overly high sensing capacitance, and thus the ASIC 10d is prevented from breaking down.

In still another embodiment, when the first sensing component 11d detects larger variation of first physical quantity and the second sensing component 11e detects smaller variation of second physical quantity, it is proper that the total area (TA1) of the first electrode units 210d in the turn-on state is smaller than the total area (TA2) of the second electrode units 210e in the turn-on state.

According to the present disclosure, the MEMS apparatus with adjustable sensing capacitance includes multiple electrical switches and multiple electrode units. The electrical switches are electrically coupled to respective electrode units, such that the working status of one electrode unit is controlled by corresponding one electrical switch. The sensing capacitance of the MEMS apparatus is able to be adjusted by independently controlling the working status of the electrode units. The MEMS apparatus with adjustable sensing capacitance is favorable for precisely detect the variation of physical quantity as well as prevent the ASIC from breaking down. When the MEMS apparatus is required to detect small variation of physical quantity, most of the electrode units is in the turn-on state (a working status when the electrode unit is supplied with electric charge). When the MEMS apparatus is required to detect large variation of physical quantity, few electrode units is in the turn-on state so as to prevent the readout circuit of the ASIC from malfunction.

The embodiments are chosen and described in order to best explain the principles of the present disclosure and its practical applications, to thereby enable others skilled in the art to best utilize the present disclosure and various embodiments with various modifications as are suited to the particular use that is being contemplated. It is intended that the scope of the present disclosure is defined by the following claims and their equivalents.

SYMBOLIC EXPLANATION 1, 1a, 1b, 1c, 1d MEMS apparatus with adjustable sensing capacitance
2d substrate
21 top surface
10, 10d ASIC
110 top surface
120, 120d readout circuit
130 electrical switch
130d first electrical switch
130e second electrical switch
11, 11a, 11b, 11c sensing component
11d first sensing component
11e second sensing component
20, 20a, 20c fixed electrode
20d first electrode
20e second electrode
210 electrode unit
210a, 210d first electrode unit
211a first electrode finger
220a, 210e second electrode unit
221a second electrode finger
210c central electrode unit
220c annular electrode unit
21, 22, 23, 24, 25, 26, 27, 28 electrode assembly
30, 30a, 30b, 30c movable electrode
30d first movable electrode
30e second movable electrode
310, 310a, 310b, 310c fixed portion
310d first fixed portion
310e second fixed portion
320, 320a, 320b, 320c movable portion
320d first movable portion
320e second movable portion
321a third electrode finger
321e movable mass block
322e elastic component
330a flexible portion

What is claimed is:

1. A microelectromechanical system apparatus with adjustable sensing capacitance, comprising:
    an application specific integrated circuit (ASIC), comprising:
        a top surface;
        a readout circuit; and
        a plurality of electrical switches; and
    a sensing component configured to detect a physical quantity, the sensing component comprising:
        a fixed electrode comprising a plurality of electrode units; and
        a movable electrode being able to move relative to the fixed electrode;
    wherein the plurality of electrical switches are respectively electrically coupled to the plurality of electrode units, a sensing capacitance of the sensing component is adjusted when a working status of one of the plurality of electrode units is controlled by corresponding one of the plurality of electrical switches.

2. The microelectromechanical system apparatus according to claim 1, further comprising a substrate, wherein the plurality of electrode units and the ASIC are disposed on the substrate.

3. The microelectromechanical system apparatus according to claim 1, wherein the working status comprises a turn-on state and a turn-off state, one of the plurality of electrode units is in the turn-on state when the ASIC supplies electric charge to the one of the plurality of the electrode units through corresponding one of the plurality of electrical switches, one of the plurality of electrode units is in the turn-off state when the ASIC does not supply electric charge to the one of the plurality of electrode units.

4. The microelectromechanical system apparatus according to claim 3, wherein some of the plurality of electrode units jointly form an electrode assembly, some of the plurality of electrical switches make the electrode units of the electrode assembly being in the same working status.

5. The microelectromechanical system apparatus according to claim 3, wherein each of the plurality of electrical switches is a capacitance sensing switch.

6. The microelectromechanical system apparatus according to claim 3, wherein each of the plurality of electrical switches is a resettable fuse switch.

7. The microelectromechanical system apparatus according to claim 1, wherein the plurality of electrode units are disposed on the top surface of the ASIC.

8. The microelectromechanical system apparatus according to claim 7, wherein the movable electrode comprises a fixed portion and a movable portion, the fixed portion is disposed on the top surface of the ASIC, and the movable portion corresponds to the plurality of electrode units.

9. The microelectromechanical system apparatus according to claim 8, wherein an end of the movable portion of the movable electrode is connected to the fixed portion, and opposite end of the movable portion overhangs the plurality of electrode units.

10. The microelectromechanical system apparatus according to claim 8, wherein the fixed portion of the movable electrode surrounds the plurality of electrode units.

11. The microelectromechanical system apparatus according to claim 8, wherein the plurality of electrode units of the fixed electrode comprise a central electrode unit and at least one annular electrode unit, and the at least one annular electrode unit surrounds the central electrode unit.

12. The microelectromechanical system apparatus according to claim 8, wherein the movable electrode is able to move relative to the fixed electrode along a direction perpendicular to a normal line of the top surface.

13. The microelectromechanical system apparatus according to claim 12, wherein the plurality of electrode units of the fixed electrode comprise at least one first electrode unit and at least one second electrode unit, the movable electrode comprises a fixed portion, a flexible portion and a movable portion, the movable portion is connected to the fixed portion via the flexible portion, the at least one first electrode unit and the at least one second electrode unit are respectively located on opposite sides of the movable portion.

14. A microelectromechanical system apparatus with adjustable sensing capacitance, comprising:
    a substrate;
    an ASIC disposed on the substrate, the ASIC comprising a readout circuit, a plurality of first electrical switches and a plurality of second electrical switches;
    a first sensing component disposed on the substrate and configured to detect a first physical quantity, the first sensing component comprising:
        a first fixed electrode comprising a plurality of first electrode units; and
        a first movable electrode being able to move relative to the first fixed electrode, the plurality of first electrical switches are respectively electrically coupled to the plurality of first electrode units, a sensing capacitance of the first sensing component is adjusted when a working status of one of the plurality of first electrode units is controlled by corresponding one of the plurality of first electrical switches; and a second sensing component disposed on the substrate and configured to detect a second physical quantity, the second sensing component comprising:
  a second fixed electrode comprising a plurality of second electrode units; and
  a second movable electrode being able to move relative to the second fixed electrode, the plurality of second electrical switches are respectively electrically coupled to the plurality of second electrode units, a sensing capacitance of the second sensing component is adjusted when a working status of one of the plurality of second electrode units is controlled by corresponding one of the plurality of second electrical switches.

15. The microelectromechanical system apparatus according to claim 14, wherein the first movable electrode comprises a first fixed portion and a first movable portion, the first fixed portion is disposed on the substrate and surrounds the plurality of first electrode units, and the first movable portion overhangs the plurality of first electrode units.

16. The microelectromechanical system apparatus according to claim 15, wherein the second movable electrode comprises a plurality of second fixed portions and a second movable portion, the plurality of second fixed portions are disposed on the substrate, the second movable portion is disposed between the plurality of second fixed portions, the second movable portion comprises a movable mass and a plurality of elastic components, the plurality of elastic components are respectively connected to the plurality of second fixed portions, the plurality of elastic components are connected to the movable mass, each of the plurality of elastic components is located between the movable mass and respective second fixed portion, and the movable mass overhangs the plurality of second electrode units.

17. The microelectromechanical system apparatus according to claim 16, wherein the first physical quantity is atmospheric pressure, and the second physical quantity is acceleration.

18. The microelectromechanical system apparatus according to claim 14, wherein the working status of the first electrode unit comprises a turn-on state and a turn-off state and the working status of the second electrode unit comprises a turn-on state and a turn-off state,
  one of the plurality of first electrode units is in the turn-on state when the ASIC supplies electric charge to the one of the plurality of first electrode units through corresponding one of the plurality of first electrical switches, one of the plurality of first electrode units is in the turn-off state when the ASIC does not supply electric charge to the one of the plurality of first electrode units,
  one of the plurality of second electrode units is in the turn-on state when the ASIC supplies electric charge to the one of the plurality of the second electrode units through corresponding one of the plurality of second electrical switches, one of the plurality of second electrode units is in the turn-off state when the ASIC does not supply electric charge to the one of the plurality of the second electrode units, and
  a total area of the first electrode units in the turn-on state is unequal to a total area of the second electrode units in the turn-on state.

19. The microelectromechanical system apparatus according to claim 18, wherein the total area of the first electrode units in the turn-on state is larger than the total area of the second electrode units in the turn-on state.

20. The microelectromechanical system apparatus according to claim 19, wherein each of the plurality of first electrode units and each of the plurality of second electrode units has the same area, and the number of the first electrode units in the turn-on state is greater than the number of the second electrode units in the turn-on state.

* * * * *